United States Patent [19]

Porter et al.

[11] Patent Number: 5,040,053
[45] Date of Patent: Aug. 13, 1991

[54] CRYOGENICALLY COOLED INTEGRATED CIRCUIT APPARATUS

[75] Inventors: Warren W. Porter, Escondido; Donald K. Lauffer, Poway, both of Calif.

[73] Assignee: NCR Corporation, Dayton, Ohio

[21] Appl. No.: 598,579

[22] Filed: Oct. 17, 1990

Related U.S. Application Data

[63] Continuation of Ser. No. 200,473, May 31, 1988, abandoned.

[51] Int. Cl.$^5$ .............................................. H01L 25/04
[52] U.S. Cl. ......................................... 357/82; 357/83
[58] Field of Search ..................................... 357/82, 83

[56] References Cited

U.S. PATENT DOCUMENTS

| | | | |
|---|---|---|---|
| 2,958,021 | 10/1960 | Cornelison et al. | 317/234 |
| 3,649,738 | 3/1972 | Anderson et al. | 174/15 |
| 3,909,225 | 9/1975 | Rooney | 62/514 |
| 4,093,971 | 6/1978 | Chu et al. | 361/382 |
| 4,145,708 | 3/1979 | Ferro et al. | 357/82 |
| 4,323,914 | 4/1982 | Berndlmaier et al. | 357/82 |
| 4,531,146 | 7/1985 | Cutchaw | 357/82 |
| 4,573,067 | 2/1986 | Tuckerman et al. | 357/82 |

FOREIGN PATENT DOCUMENTS 61-47653  3/1986  Japan ................................. 357/82

OTHER PUBLICATIONS

IBM TDB, vol. 22, #4, p. 1553, by Nufer, Sep. 1979.

*Primary Examiner*—Mark Prenty
*Attorney, Agent, or Firm*—Wilbert Hawk, Jr.; Stephen F. Jewett; Douglas S. Foote

[57] ABSTRACT

A cryogenically cooled integrated circuit apparatus is disclosed. The apparatus includes a cryogenic vessel with an integrated circuit package positioned in an opening at one end. One face of the integrated circuit is in direct contact with cryogenic fluid and a second face has a standard pin array which is connectable to a printed circuit board.

6 Claims, 1 Drawing Sheet

CRYOGENICALLY COOLED INTEGRATED CIRCUIT APPARATUS

This is a continuation of co-pending application Ser. No. 200,473 filed on May 31, 1988 and now abandoned.

BACKGROUND OF THE INVENTION

The present invention relates to means for cryogenically cooling semiconductor devices.

It is well known that the performance of some semiconductor devices can be improved by cooling them to cryogenic temperatures. Typically, such cooling can be achieved by the use of a cryogenic fluid such as liquid or gaseous Nitrogen or Helium.

Where only certain semiconductor devices in an existing electronic apparatus are to be cooled, it is desirable to selectively cool such devices with minimum modification of the electronic apparatus. Significant savings in design and fabrication costs are available if cooling of individual components can be achieved without redesigning the apparatus. For example, an existing computer might be able to be improved by the selective cooling of some, but not all, of its components.

To most efficiently utilize the cryogenic fluid it is further desirable to cool only those portions of a device that require cooling. For example, an integrated circuit chip may require cooling but its mounting pins do not.

OBJECTS OF THE INVENTION

It is, therefore, an object of the present invention to provide a new and improved cryogenically cooled integrated circuit apparatus.

It is another object of the present invention to provide a cryogenically cooled integrated circuit apparatus which is interchangeable with a similar integrated circuit which is not cooled.

It is yet another object of the present invention to provide a cyrogenically cooled integrated circuit apparatus which efficiently utilizes cooling fluid by selective application to portions of an integrated circuit device.

SUMMARY OF THE INVENTION

The present invention is a cryogenically cooled integrated circuit apparatus which includes a vessel for holding cryogenic fluid and an integrated circuit package positioned within an opening at one end of the vessel. The integrated circuit package includes an integrated circuit die, a protective body with first and second faces and which surrounds an edge portion of the die, a metal lid, and a plurality of metal pins. The metal lid is attached to the die and to a portion of the first face of the protective body. The metal pins are attached to the opposite or second face of the body and are electronically connected to the die. The package is positioned so that the lid is in direct contact with the fluid and the pins extend away from the vessel.

According to one embodiment of the present invention the lid is coplanar with the protective body and die. A seal between the vessel and package is formed between the vessel and protective body.

According to another embodiment of the present invention the lid has a wall which extends away from the first face of the protective body and mates with the vessel opening thereby forming a seal.

DETAILED DESCRIPTION OF THE PREFERRED EMBODIMENTS

Figure 1:
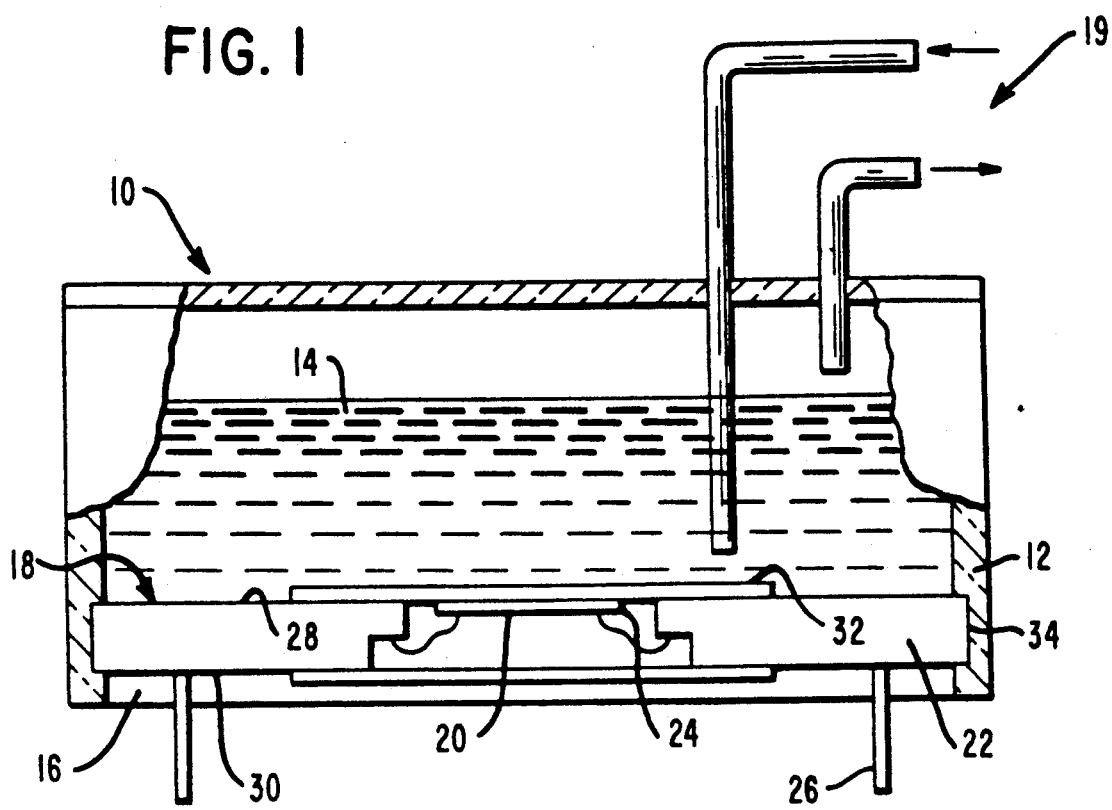
FIG. 1 is a cross sectional schematic view of a cryogenically cooled integrated circuit apparatus according to one form of the present invention.

FIG. 1 shows a cryogenically cooled integrated circuit apparatus 10. Apparatus 10 comprises a vessel 12 for holding a cryogenic fluid 14 such as liquid Nitrogen or liquid Helium or other cooling medium. Vessel 12 may be cylindrical, rectangular or other shape depending upon its application and has an opening 16 at one end thereof. Opening 16 is sealed by an integrated circuit package 18 as will be discussed more fully hereinafter. Fluid transfer means 19 supply cooled fluid to vessel 12 and remove warmed fluid such as gas.

Apparatus 10 also comprises integrated circuit package 18. The package includes an integrated circuit die 20 and a protective body 22 which surrounds an edge portion 24 of die 20. Protective body 22 is a plastic or ceramic material and provides protection for die 20 as well as support for metal leads or pins 26. An important feature of the subject invention is that the configuration or arrangement of pins 26 is conventional. This allows apparatus 10 to be inserted into a printed circuit board in substitution for a similar conventional circuit.

Protective body 22 has first and second opposite faces 28 and 30, respectively. A metal lid 32 which is part of integrated circuit package 18 is brazed or otherwise attached to die 20 and a portion of first face 28. Lid 32 provides a protective seal for die 20 as well as thermally connecting die 20 to cryogenic fluid 14. Pins 26 are brazed or otherwise attached to second face 30 and are electronically connected to die 20.

Integrated circuit package 18 is positioned within vessel opening 16 so that lid 32 is in direct contact with cryogenic fluid 14 and pins 26 extend away from vessel 12. A seal 34 is formed between vessel 12 and protective body 22 to prevent leakage of cryogenic fluid 12.

Figure 2:
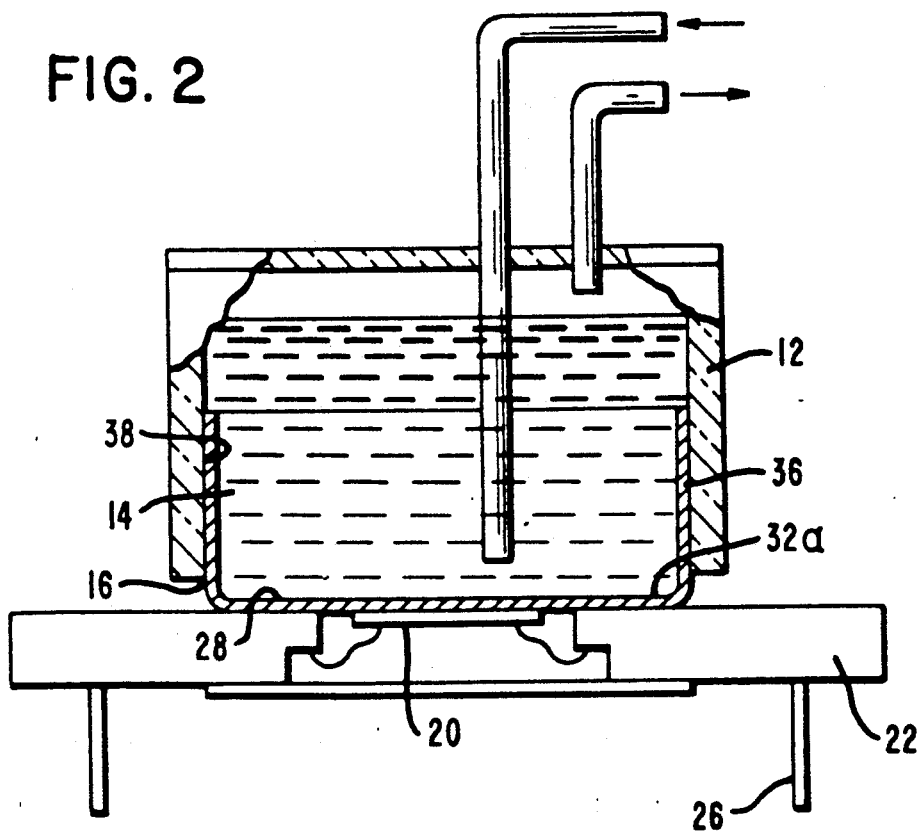
FIG. 2 is a cross sectional schematic view of a cryogenically cooled integrated circuit apparatus according to an alternative form of the present invention.

FIG. 2 shows an alternative form of the present invention. Unlike the embodiment shown in FIG. 1 where lid 32 is generally coplanar with the first face 28 of protective body 22, lid 32a in FIG. 2 includes a wall 36 which extends away from first face 28. Wall 36 is constructed to mate with the interior surface 38 of vessel 12 and form a seal therebetween. For example, if vessel 12 is cylindrical, wall 36 of lid 32a will similarly be cylindrical in shape. This configuration provides for enhanced simplicity and ease of assembly.

The protective body 22 extends beyond vessel opening 16. This allows for pins 26 to be further removed from cryogenic fluid 14 than in the FIG. 1 embodiment. Since leads 26 tend to heat during operation, heat conduction into fluid 14 is thereby further reduced.

Both embodiments provide selective cooling to die 20 by bringing the die lid into direct contact with cryogenic fluid 14.

It will be clear to those skilled in the art that the present invention is not limited to cryogenic cooling of integrated circuits but applies equally to cryogenic cooling of any temperature sensitive electronic device.

It will be further understood that the dimensions and proportional and structural relationships shown in the Figures are illustrated by way of example only and these illustrations are not to be taken as the actual dimensions or proportional structural relationship used in an actual apparatus of the present invention. Numerous modifications, variations, and full and partial equivalents can be undertaken without departing from the invention as limited only by the spirit and scope of the appended claims

We claim:

1. A cryogenically cooled integrated circuit apparatus comprising:
    a vessel or holding cryogenic fluid, said vessel having an opening at one end thereof; and
    an integrated circuit package having:
        an integrated circuit die;
        a protective body with first and second faces and which surrounds an edge portion of said die;
        a metal lid, attached to said die and to a portion of said first face of said protective body, and
        a plurality of metal pins attached to said second face of said body and electrically connected to said die; wherein
    said integrated circuit package is positioned within said vessel opening so that said lid is in direct contact with said cryogenic fluid and said pins extend away from said vessel.

2. The apparatus of claim 1 wherein said vessel has an interior surface and said lid includes a wall which extends away from said first face and mates with said interior surface.

3. The apparatus of claim 2 wherein said lid wall and said vessel interior surface form a seal.

4. The apparatus of claim 2 wherein said protective body extends beyond said vessel opening.

5. The apparatus of claim 1 wherein said lid is coplanar with said first face and said die.

6. The apparatus of claim 5 wherein said protective body is positioned within said opening so that a seal is formed between said vessel and said body.

* * * * *